United States Patent
Hsieh et al.

(10) Patent No.: US 11,448,978 B2
(45) Date of Patent: *Sep. 20, 2022

(54) CONTAMINATION HANDLING FOR SEMICONDUCTOR APPARATUS

(71) Applicant: Taiwan Semiconductor Manufacturing Co., Ltd., Hsinchu (TW)

(72) Inventors: Fu-Chun Hsieh, Hsinchu (TW); Chih-Che Lin, Jhubei (TW); Pei-Yi Su, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/226,904

(22) Filed: Apr. 9, 2021

(65) Prior Publication Data

US 2021/0223709 A1    Jul. 22, 2021

Related U.S. Application Data

(63) Continuation of application No. 16/456,103, filed on Jun. 28, 2019, now Pat. No. 10,976,676.

(60) Provisional application No. 62/737,677, filed on Sep. 27, 2018.

(51) Int. Cl.
  *G03F 7/20* (2006.01)
  *G03F 7/16* (2006.01)
  *H01L 21/67* (2006.01)

(52) U.S. Cl.
  CPC ............ *G03F 7/70925* (2013.01); *G03F 7/16* (2013.01); *G03F 7/162* (2013.01); *G03F 7/7085* (2013.01); *G03F 7/70916* (2013.01); *H01L 21/6715* (2013.01); *H01L 21/67253* (2013.01)

(58) Field of Classification Search
  None
  See application file for complete search history.

(56) References Cited

U.S. PATENT DOCUMENTS

| | | | |
|---|---|---|---|
| 10,976,676 B2 * | 4/2021 | Hsieh | G03F 7/70925 |
| 2002/0090735 A1 | 7/2002 | Kishkovich et al. | |
| 2002/0144719 A1 | 10/2002 | Nagamine | |
| 2019/0378739 A1 | 12/2019 | Kiyotomi et al. | |
| 2020/0103768 A1 | 4/2020 | Hsieh et al. | |

* cited by examiner

*Primary Examiner* — Michelle M Iacoletti
(74) *Attorney, Agent, or Firm* — Sterne, Kessler, Goldstein & Fox P.L.L.C.

(57) ABSTRACT

The present disclosure describes a lithography apparatus comprising a photoresist coating unit configured to perform one or more coating processes on a substrate. The lithography apparatus further comprises a detection unit configured to determine a contamination level of a contaminant from the one or more coating processes adheres on a sidewall of the lithography apparatus. The lithography apparatus further comprises a controller unit configured to adjust one or more operations of the lithography apparatus based on a comparison between the contamination level and a baseline cleanliness requirement of the lithography apparatus.

20 Claims, 5 Drawing Sheets

| | Photolithography | | |
|---|---|---|---|
| | #1 | #2 | #3 |
| Characteristic score of coating material | $x_1$ | $x_2$ | $x_3$ |
| Usage of coating material | $v_1$ | $v_2$ | $v_3$ |
| Individual contamination level | $x_1 v_1$ | $x_2 v_2$ | $x_3 v_3$ |

CONTAMINATION HANDLING FOR SEMICONDUCTOR APPARATUS

CROSS-REFERENCE TO RELATED APPLICATIONS

This application is a continuation of U.S. non-Provisional patent application Ser. No. 16/456,103, titled "Contamination Handling for Semiconductor Apparatus" and filed on Jun. 28, 2019, which claims benefit of U.S. Provisional Patent Application No. 62/737,677, titled "Design Cup Wash Trigger Timing By Sensor" and filed on Sep. 27, 2018, the disclosures of which are incorporated by references herein in their entireties.

BACKGROUND

With advances in semiconductor technology, there has been increasing demand for high yield and throughput of the lithography process for manufacturing semiconductor devices. To meet these demands, it is crucial to prevent lithography apparatus failures to ensure a reliable lithography process.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on or over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "about" indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

A lithography apparatus is widely used to conduct a lithography process to define various patterns on semiconductor wafers. The lithography apparatus can include a coating module configured to form a photoresist film on a semiconductor wafer by dispatching a photoresist on one or more areas of the semiconductor wafer, followed by spinning the semiconductor wafer to form a centrifugal force to distribute the dispatched photoresist over the entire wafer surface. To ensure reliability and yield of the lithography process, a surface of the resulting photoresist film must be clean and free from adhesion of contaminants, such as suspended particles. As a result, the coating module can include a ventilation or exhaust pump to ventilate or vent an atmosphere inside the coating module to reduce suspended particles.

The coating module can further include a drain cup structure to capture a portion of the dispatched photoresist sprayed from the semiconductor wafer during the spinning of the semiconductor wafer. The photoresist captured by the drain cup structure can be further fluidly transferred to a drain. Nevertheless, since the photoresist can dry in an atmosphere environment, the captured photoresist can solidify, thus adhering to the drain cup structure. A portion of the solidified photoresist can further clog an inlet of the ventilation or exhaust pump interconnected with the drain and/or the drain cup structure. This can jeopardize the ventilation and exhaustion capability provided by the ventilation or exhaust pump for reducing the suspended particles. As a result, the coating module can additionally include a solvent dispenser configured to dispense a solvent to decontaminate the drain cup structure at designated times. However, such regularly decontamination can either delay a manufacturing schedule associated with the lithography apparatus or fail to timely clean the drain cup structure, thus impacting overall productivity or yield, respectively, of the lithography process.

The present disclosure is directed to a lithography apparatus and methods to handle contamination in the lithography apparatus. In some embodiments, the lithography apparatus can include a sensor, a flow meter, and a pressure gauge to monitor a contamination level in the lithography apparatus. Data recorded by the sensor, the flow meter, or the pressure gauge can be received by a computer system configured to run a procedure to decontaminate the lithography apparatus. A benefit of the present disclosure is to provide a mechanism to dynamically decontaminate the lithography apparatus, thus avoiding unnecessary maintenance procedures and balancing requirements of yield and productivity of semiconductor device manufacturing.

Figure 1:
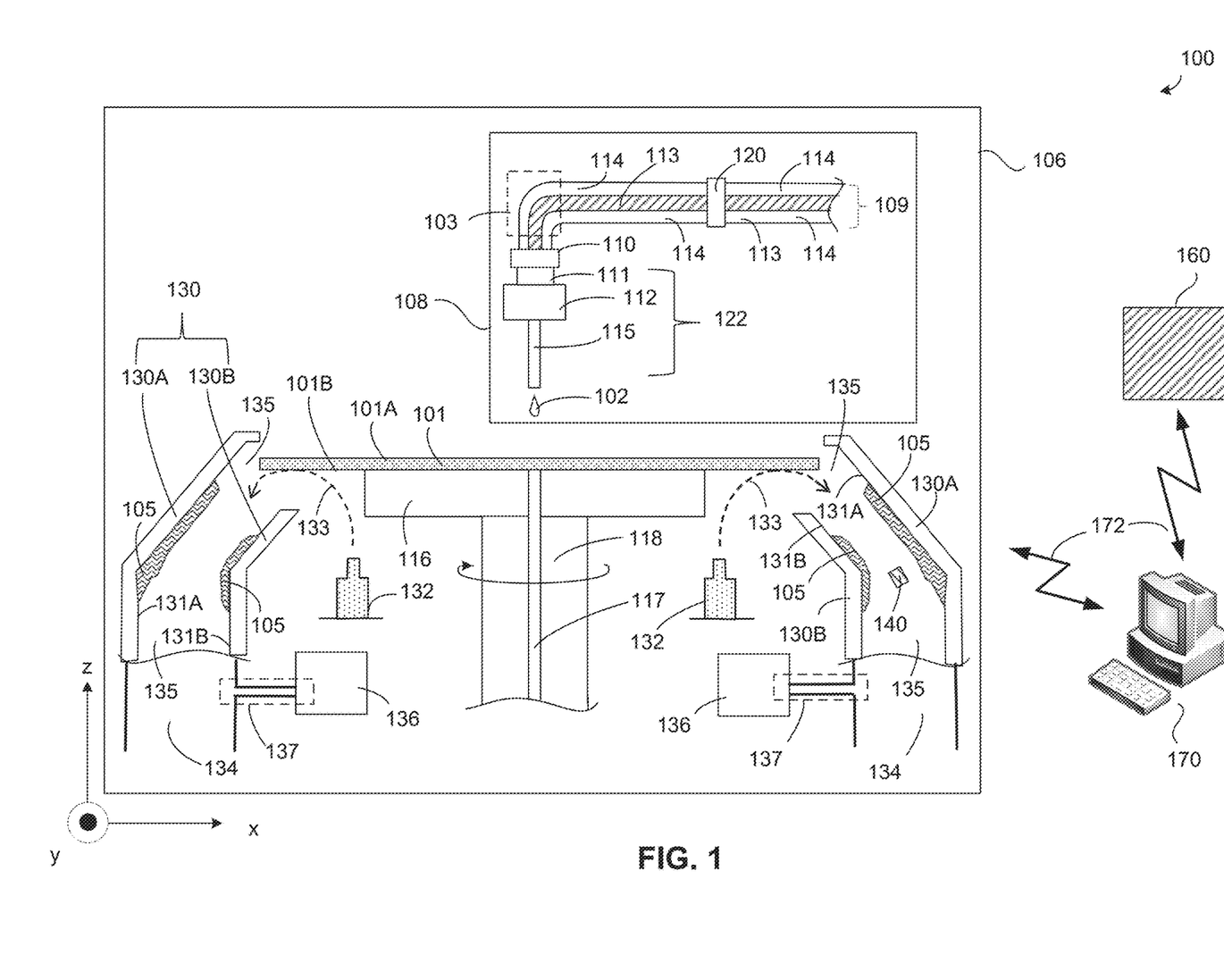
FIG. 1 illustrates a plan view of a lithography apparatus, according to some embodiments.

FIG. 1 illustrates a plan view of a lithography apparatus 100 configured to conduct a lithography process on a substrate (e.g., a substrate 101), according to some embodiments. Lithography apparatus 100 can include a photoresist coating module 106 configured to coat a coating material 102 (e.g., a photoresist or any other fluid organic material) on the substrate (e.g., substrate 101) and an illumination module 160 configured to condition a radiation beam for irradiating the substrate. Lithography apparatus 100 can also include a controller unit 170 configured to communicate with photoresist coating module 106 and illumination module 160 via a communication mechanism 172. In some embodiments, lithography 100 can further include other modules not included in FIG. 1, such as a projection module configured to direct the radiation beam to expose the substrate or a supporting structure configured to hold a photo mask, where each of the other modules can be further configured to communicate with controller unit 170 via communication mechanism 172.

Photoresist coating module 106 can include a chuck 116 configured to hold substrate 101, a spindle 118 configured to provide a rotation mechanism for chuck 116, a circularly shaped drain cup structure 130 enclosing and surrounding chuck 116, a detection module 140 disposed at a space 135 between drain cup structure 130 and chuck 116, one or more solvent dispensers 132 disposed below chuck 116, and a photoresist feeder 108 configured to dispatch coating material 102 onto one or more areas of substrate 101. In some embodiments, photoresist coating module 106 can have multiple photoresist feeders 108, where each photoresist feeder 108 can be configured to dispatch different species of coating material 102. For illustration purposes, FIG. 1 includes selected portions of photoresist coating module 106 and other components, such as robotic arms and solvent banks, are not shown.

Substrate 101 can include a top surface 101A, where lithography apparatus 100 can conduct lithography process on top surface 101A. Substrate 101 can be mounted on chuck 116 to receive coating material 102. For example, substrate 101 can further include a bottom surface 101B opposite to top surface 101A, where bottom surface 101B can be in contact with chuck 116, and top surface 101A can be configured to receive coating material 102 from photoresist feeder 108. Chuck 116 can be stationary or rotated by spindle 118 to provide a centrifugal force to spread and distribute the dispatched coating material 102 across substrate 101's top surface. In some embodiments, a passage structure 117 can be included in photoresist coating module 106 and embedded in chuck 116 and spindle 118, where a vacuum suction can be provided through passage structure 117 to secure substrate 101 on chuck 116.

Drain cup structure 130 can include one or more drain cups surrounding chuck 116 to capture coating material 102 sprayed from substrate 101. For example, drain cup structure 130 can include an outer drain cup 130A surrounding chuck 116, where a portion of sidewalls 131A of outer drain cup 130A can be disposed above a periphery of chuck 116 to capture coating material 102 discharged from substrate 101's top surface. A portion of the captured coating material 102 can be further fluidly directed to an exhaust pathway 134 interconnected with outer drain cup 130A, while an other portion of the captured coating material 102 can dry and become solidified coating material 105 (herein referred as "residue 105") stuck to sidewalls 131A. Drain cup structure 130 can further include an inner drain cup 130B surrounding chuck 116, where inner drain cup 130B can be surrounded by outer drain cup 130A. Inner drain cup 130B can include sidewalls 131B disposed below the periphery of chuck 116 to capture coating material 102 discharged from substrate 101's top surface. Similar to outer drain cup 130A, a portion of the captured coating material 102 can be fluidly direct to exhaust pathway 134 interconnected with inner drain cup 130B while an other portion of the captured coating material 102 can become residue 105 adhered to sidewalls 131B.

In some embodiments, detection module 140 can be disposed at a space 135 that can be defined as a space between outer drain cup 130A and chuck 116. In some embodiments, detection module 140 can be disposed at a space 135 that can be defined as a space between inner drain cup 130B and chuck 116. In some embodiments, detection module 140 can be disposed at a space 135 that can be defined as a space between outer drain cup 130A and inner drain cup 130B.

Dispensers 132 can be configured to eject a solvent to remove residue 105 adhered to the sidewalls of drain cup structure 130 (e.g., sidewalls 131A-131B), where the solvent can be any suitable chemical, such as acetone or a photoresist thinner, to dissolve or etch residue 105. For example, solvent dispensers 132 can eject solvent 133 towards bottom surface 101B of a spinning substrate 101, where the spinning substrate 101 can provide a centrifugal force to spray solvent 133 towards drain cup structure 130. Residue 105 adhered to sidewalls 131A-131B can then be dissolved by solvent 133 and fluidly directed to exhaust pathway 134.

Photoresist coating module 106 can further include a pumping unit 136 with an inlet region 137 interconnected with exhaust pathway 134. Pumping unit 136 can be a ventilation pump to ventilate or vent an atmosphere inside photoresist coating module 106 for reducing suspended particles in photoresist coating module 106. Pumping unit 136 can also be configured to provide a pressure difference for aiding the discharged coating material 102 flowing from drain cup structure 130 towards exhaust pathway 134. In some embodiments, pumping unit 136 can further include a pressure gauge or a flow meter (both not shown in FIG. 1) to monitor a vacuum signature associated with a clogging condition of inlet region 137. For example, residue 105 can clog inlet region 137 and inhibit air flowing from drain cup structure 130 to exhaust pathway 134, thus causing a respective pressure drop or flow rate drop at inlet region 137. In some embodiments, the pressure gauge or the flow meter of pumping unit 136 can be communicated with controller unit 170.

Detection module 140 can be configured to monitor drain cup structure 130 and communicate with controller unit 170. For example, detection module 140 can be configured to monitor sidewalls 131A-131B while chuck 116 is stationary or a lithography process is conducted by lithography apparatus 100. Detection module 140 can include an image sensor (e.g., a charge coupled device (CCD) sensor) configured to record visual signatures of drain cup structure 130 (e.g., sidewalk 131A-131B), where the visual signature can include images or videos of residue 105 adhered to drain cup structure 130. The images/videos can have any suitable format, such as a suitable resolution (e.g., 640 pixels×480 pixels), greyscale (e.g., 256 combinations of shades of gray), chrominance, or frame rate (e.g., 30 pictures per second). Data associated with the visual signatures can be sent to controller unit 170 or a computer system (not shown in FIG. 1) for determining a contamination characteristic associated with residue 105 adhered to drain cup structure 130 (e.g., at sidewalls 131A-131B).

In some embodiments, detection module 140 can also include an optical module (e.g., a fiber sensor) configured to transmit and receive one or more optical signals associated with measuring a surface coverage or a thickness of residue 105 on drain cup structure 130. For example, detection module 140 can be configured to transmit an optical signal towards sidewalls 131A-131B, and receive another optical signal reflected, deflected, or refracted from sidewalls 131A-131B, where an intensity difference or a phase difference between the transmitted and received optical signal can be associated with the surface coverage of the thickness of residue 105 on drain cup structure 150. Optical data associated with such intensity/phase difference can be sent to controller unit 170 or a computer system (not shown in FIG. 1) for determining the contamination characteristic at drain cup structure 130 (e.g., at sidewalls 131A-131B). In some embodiments, the optical module can include a fiber sensor or any other suitable optical sensor.

In some embodiments, detection module 140 can also include an acoustic module configured to transmit and receive one or more acoustic signals associated with a surface coverage or a thickness of residue 105 on drain cup structure 130. Similar to the previous discussion of the embodiments of the optical module, acoustic data associated with an intensity/phase difference between the transmitted/received acoustic signals can be sent to controller unit 170 or a computer system (not shown in FIG. 1) for determining the contamination characteristic at drain cup structure 130. In some embodiments, the acoustic module can include an ultrasonic sensor or any other suitable sensor.

Photoresist feeder 108 can include a photoresist cartridge 122 configured to output coating material 102, a fluid conduit 109 fluidly connected to photoresist cartridge 122, and a fluid leakage handling device 110 configured to capture and detect a fluid leakage of fluid conduit 109. Photoresist feeder 108 can be mobile in photoresist coating module 106, such that photoresist feeder 108 can be moved between a space above chuck 116 and another location in photoresist coating module 106. For example, photoresist feeder 108 can be grabbed by a robotic arm (not shown in FIG. 1) of photoresist coating module 106 and be moved between chuck 116 and a solvent bank (not shown in FIG. 1) of photoresist coating module 106, where the solvent bank can be configured to preserve a cleanliness of photoresist cartridge 122. Photoresist feeder 108 can also be positioned above multiple areas of chuck 116 to dispatch coating material 102 on multiple areas of substrate 101.

Photoresist cartridge 122 can include a photoresist dispensing nozzle 115 configured to dispense coating material 102 and a holder 112 configured to house photoresist dispensing nozzle 115 and fluid conduit 109. In some embodiments, photoresist cartridge 122 can further include a connector 111 to secure a connection between fluid conduit 109 and holder 112. Photoresist dispensing nozzle 115 can be a tapered or straight-bore pipe structure (not shown in FIG. 1) configured to receive coating material 102 from fluid conduit 109 and dispense coating material 102 to substrate 101 secured on chuck 116. In some embodiments, photoresist dispensing nozzle 115 can further include a chamber (not shown in FIG. 1) interconnected with the tapered or straight-bore pipe structure, where an enclosure of the chamber can be configured to store coating material 102 provided by fluid conduit 109. Holder 112 can include a handle structure (not shown in FIG. 1) for a robotic arm of photoresist coating module 106 to carry photoresist cartridge 122. For example, the robotic arm can grab holder 112's handle structure to move holder 112, together with photoresist dispensing nozzle 115 and fluid conduit 109, between multiple locations in photoresist coating module 106.

Fluid conduit 109 can include a photoresist pipe 113 configured to transport coating material 102 to photoresist cartridge 122. An end of photoresist pipe 113 can be fluidly connected to photoresist dispensing nozzle 115. Another end of photoresist pipe 113 can be fluidly connected to a chemical storage container (not shown in FIG. 1) that stores coating material 102. In some embodiments, a pump (not shown in FIG. 1) can be fluidly connected between photoresist pipe 113 and the chemical storage container, where the pump can be configured to introduce coating material 102 from the chemical storage container to photoresist cartridge 122. Fluid conduit 109 can further include a circulation pipe 114 surrounding and contacting photoresist pipe 113, where circulation pipe 114 can be configured to circulate a coolant (e.g., water) to stabilize or regulate a temperature of coating material 102 in photoresist pipe 113. Both photoresist pipe 113 and circulation pipe 114 can be made of a soft material (e.g., a plastic material) that is bendable, extendable, and retractable. As a result, both photoresist pipe 113 and circulation pipe 114 can include one or more bending/stretching segments 103, where the one or more bending/stretching, segments 103 can allow fluid conduit 109 and photoresist cartridge 122 to be displaced between multiple locations within photoresist coating module 106. In some embodiments, bending/stretching segments 103 can have one or more areas that leaks coolant from circulation pipe 114, thus contaminating substrate 101.

Fluid conduit 109 can further include a flow meter 120 configured to measure fluid movement in fluid conduit 109 and communicate with controller unit 170 to transmit data associated with the monitored fluid movement. Flow meter 120 can be connected in series with fluid conduit 109 such that one or more fluids in fluid conduit 109 can pass through flow meter 120 to measure flow rate. For example, flow meter 120 can be a two-port device with a first port at a first side and a second port at a second side opposite to the first side. The first and second ports are connected to photoresist pipe 113 to allow coating material 102 to fluidly pass through flow meter 120 to measure flow rate of coating material 102. In some embodiments, flow meter 120 can be an obstruction-type flow meter, a turbine-type flow meter, an electromagnetic flow meter, a positive displacement-type flow meter, a fluid dynamic-type flow meter, an ultrasonic-type flow meter, a mass flow meter, or any other suitable type of flow meter. In some embodiments, flow meter 120 can be further configured to receive one or more instructions from controller unit 170 to regulate fluid movement in fluid conduit 109.

Fluid leakage handling device 110 can include a container (not shown in FIG. 1) configured to capture a fluid leaked from fluid conduit 109 (referred to herein as "fluid leakage"), such as coolant leaked from circulation pipe 114 or coating material 102 leaked from photoresist pipe 113. Fluid leakage handling device 110 can further include a fluidic sensor (not shown in FIG. 1) configured to detect the fluid leakage, where the fluidic sensor can communicate with controller unit 170 via communication mechanism 172. Fluid leakage handling device 110 can be disposed above chuck 116. For example, fluid leakage handling device 110 can be placed at or near an outer surface of fluid conduit 109 or an outer surface of photoresist cartridge 122. In some embodiments, fluid leakage handling device 110 can be disposed between photoresist cartridge 122 and chuck 116, where photoresist cartridge 122 can dispense coating material 102 on substrate 101 through fluid leakage handling device 110.

In some embodiments, lithography apparatus 100 can further include another fluid leakage module (not shown in FIG. 1) configured to detect a fluid leakage in lithography apparatus 100, where fluid leakage handling device 110 can be configured to communicate with the other fluid leakage module, and the other fluid leakage module can be configured to communicate with controller unit 170.

Controller unit 170 can include any suitable computer system (e.g., workstation or portable electronic device) to store programs and data for various operations of each modules of lithography apparatus 100, to instruct lithography apparatus 100 to conduct the lithography process on a substrate. For example, controller unit 170 can be configured to instruct photoresist coating module 106 to conduct the photoresist coating process on substrate 101, including controlling a displacement of photoresist feeder 108 or a rotation of chuck 116. The different functions of controller unit 170 should not be limited by the embodiments of the present disclosure. Communication mechanism 172 can include any suitable network connection between controller unit 170 and each module of lithography apparatus 100. For example, communication mechanism 172 can include a local area network (LAN) and/or a WiFi network. In some embodiments, controller unit 170 can transmit control signals through communication mechanism 172 to control the rotation of chuck 116 or the displacement of photoresist feeder 108.

In some embodiments, controller unit 170 can be configured to perform a computing procedure to analyze the visual signature data, the optical data, the acoustic data, the fluid movement data, or the vacuum signature data to determine the contamination characteristic of drain cup structure 130. The computer procedure can include one or more mathematical operations, a pattern recognition procedure, a big data mining procedure, or a machine learning procedure, such as a neural network algorithm or a regression algorithm, to analyze, classify, or cluster the visual signature/optical/acoustic/fluid movement/vacuum signature data.

Figure 2:
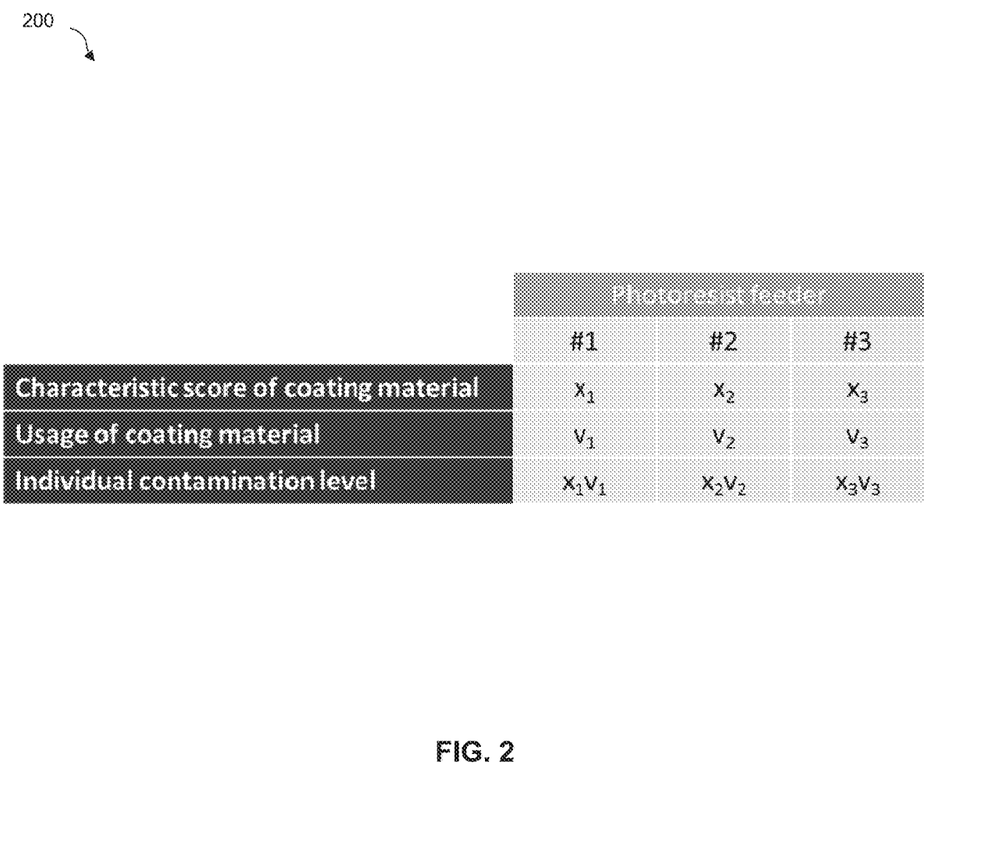
FIG. 2 illustrates a chart for determining a contamination level in a lithography apparatus, according to some embodiments.

FIG. 2 illustrates a chart 200 to determine a contamination level at drain cup structure 130 based on usages of one or more photoresists consumed by photoresist coating module 106, according to some embodiments. As shown in FIG. 2, chart 200 indicates a photoresist coating module 106 with three photoresist feeders 108, where each of the photoresist feeders 108 can be associated with coating material 102 having a respective usage and respective physical properties. Even though three photoresist feeders 108 are considered here, chart 200 can be applied to a photoresist coating module 106 with one or more photoresist feeders 108.

Each of the characteristics scores $x_1$-$x_3$ can be determined based on the physical properties of the respective coating material 102, such as a viscosity, a density, or a surface tension. For example, each characteristic score can be proportional to the respective coating material 102's viscosity. In some embodiments, each characteristic score can be a nominal thickness of a film produced by spin-coating the respective coating material 102 on a substrate, because such nominal thickness can be associated with the physical properties of the respective coating material 102. For example, a photoresist with higher viscosity can generate a thicker photoresist film compared to the one with lower viscosity under a same coating recipe (e.g., spinning speed), thus having a higher characteristic score in chart 200.

Each of the coating material usages $v_1$-$v_3$ can be determined based on a volume of a respective coating material 102 outputted by the respective photoresist feeder 108. In some embodiments, each of the photoresist usages $v_1$-$v_3$ can be proportional to a flow rate of the respective coating material 102 fluidly transported in the respective photoresist feeder 108, where such flow rate can be measured by flow meter 120 of the respective photoresist feeders 108. In some embodiments, each of the photoresist usages $v_1$-$v_3$ can be a product of the flow rate and a respective dispensing time of the coating material 102 dispensed by the respective photoresist feeder 108, where such dispensing time can be provided by controller unit 170 or the respective photoresist feeder 108.

Each of the individual contamination levels can be associated with an amount of residue 105 contributed by the respective photoresist feeder 108. For example, each of the individual contamination levels can be proportional to a usage of the respective coating materials (e.g., $v_1$). In some embodiments, each of the individual contamination can be proportional to a weighted usage of the respective coating material (e.g., $x_1v_1$). A contamination level associated with a residue 105 adhered to sidewalls of drain cup structure 130 can therefore be proportional to a weighted sum of the coating material usages (e.g., $v_1$-$v_3$) based on the characteristics scores (e.g., $x_1$-$x_3$). In other words, a coating material with high viscosity and/or high usage can contribute a respective more amount of residue 105, thus contributing a higher contamination level. Accordingly, as illustrated in chart 200, the contamination level contributed by each of the three photoresist feeders 108 can be proportional to $x_1v_1+x_2v_2+x_3v_3$.

Figure 3:
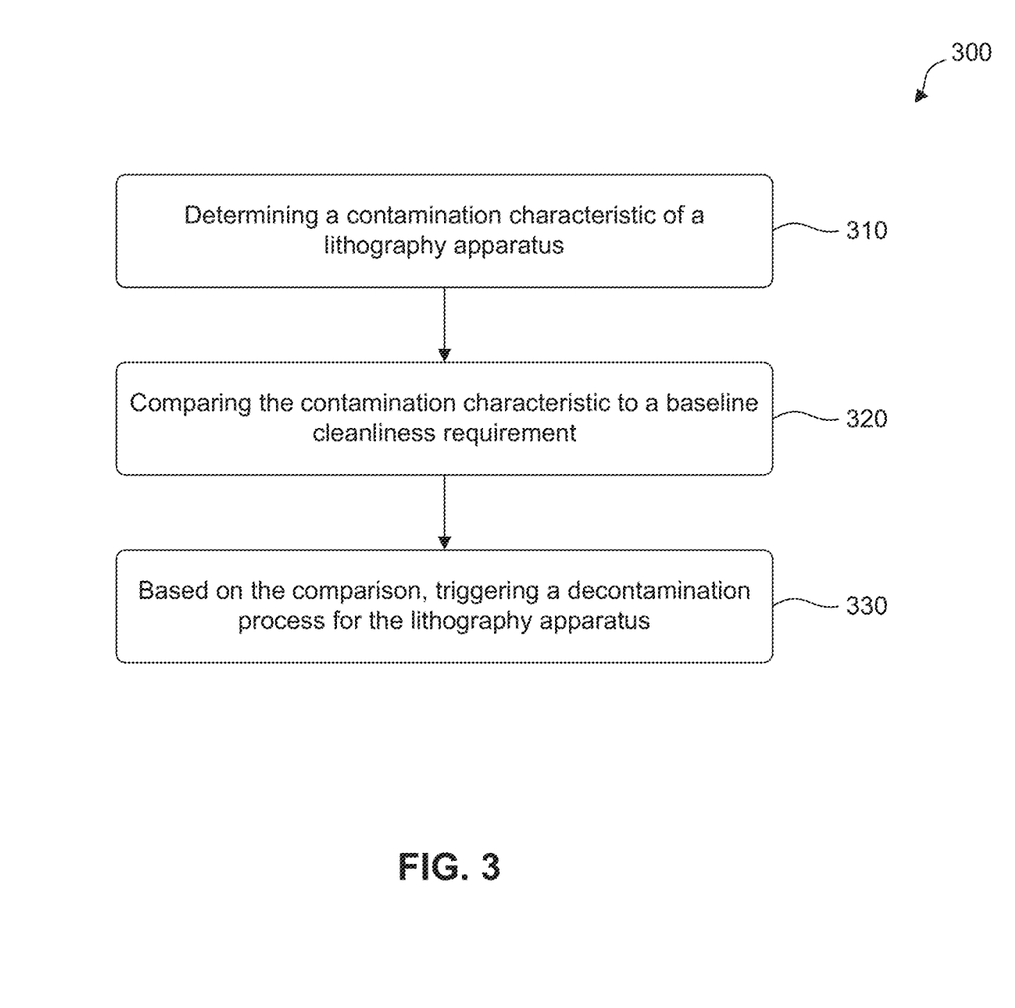
FIG. 3 illustrates a method for operating a lithography apparatus, according to some embodiments.

FIG. 3 is a method 300 for operating a lithography apparatus, according to some embodiments of the present disclosure. Operations shown in method 300 are not exhaustive; other operations can be performed as well before, after, or between any of the illustrated operations. In some embodiments, operations of method 300 can be performed in a different order. Variations of method 300 are within the scope of the present disclosure.

Method 300 begins with operation 310, where a contamination characteristic of the lithography apparatus is determined. Such determination can be performed in parallel with an on-going lithography process conducted by the lithography apparatus (e.g., lithography apparatus's chuck is rotating.) In some embodiments, the determination can be performed while the lithography apparatus is idle (e.g., lithography apparatus's chuck is stationary.)

The contamination characteristic can include a visual signature of one or more coating materials adhered to the drain cup structure (referred to herein as "the contaminants at the drain cup structure"). The determination of such contamination characteristic can include collecting a visual signature (e.g., images or videos) of one or more areas of the drain cup structure's sidewalls via an image sensor, where the visual signature can include information of color saturation, color gradation, contrast, or brightness associated with the contaminants at the drain cup structure. In some embodiments, the collection of the visual signature is described above with respect to FIG. 1.

In some embodiments, the contamination characteristic can include a surface coverage and/or a thickness of the contaminants at the drain cup structure. The determination of such contamination characteristic can include emitting an optical/acoustic signal towards one or more areas of the drain cup structure and measuring a reflected or scattered optical/acoustic signal from the drain cup structure. Based on a wavelength of the emitted or measured optical/acoustic signals, the surface coverage and/or the thickness of the contaminants at the one or more areas of the drain cup structure can be inferred by calculating an intensity difference or a phase difference between the emitted and the measured optical/acoustic signals. The optical/acoustic emission, the optical/acoustic measurement, and the calculation of intensity/phase difference can be conducted by an optical/acoustic module of the lithography apparatus. In some embodiments, the calculation can be conducted by a computer system. In some embodiments, the optical/acoustic emission, the optical/acoustic measurement, and the calculation of intensity/phase difference are described above with respect to FIG. 1.

In some embodiments, the contamination characteristic can also include an amount of usage of each of the coating materials consumed by the lithography apparatus, where the determination of such contamination characteristic can include measuring a flow rate of each of the coating materials via one or more flow meters of the lithography apparatus and recording a dispensing time of each of the coating materials. Since an amount of the contaminants at the drain cup structure can be proportional to a usage of each of the coating materials, the contamination characteristic can therefore be calculated based on the measured flow rate, dispensing time, and physical characteristic e.g., viscosity and/or density) of each of the coating material. In some embodiments, the flow rate measurement, the recording of the dispensing time, and the calculation of the contamination characteristic are described above with respect to FIGS. 1 and 2.

In some embodiments, the contamination characteristic can further include a vacuum signature at an inlet region of a ventilation pump of the lithography apparatus, where the determination of such contamination characteristic can further include monitoring a pressure or a gas flow at the inlet region of a ventilation pump. Since the contaminants adhered to the drain cup structure can clog the inlet region, the pressure or the gas flow at the inlet region can change the contaminants builds up. The vacuum signature can be monitored by a pressure gauge or a flow meter at the inlet region, where the pressure gauge or the flow meter can be configured to communicate with a computer system. In some embodiments, the monitoring the vacuum signature is described above with respect to FIG. 1.

In operation 320, the contamination characteristic is compared to a baseline cleanliness requirement. The baseline cleanliness requirement can be associated with a qualified ventilation or venting capability of the lithography apparatus. For example, the qualified ventilation capability can ensure suspended particles are effectively suppressed in the lithography apparatus, thus maintaining a yield requirement of the lithography process conducted by the lithography apparatus. The baseline cleanliness requirement can include a predefined visual signature of a drain cup structure of the lithography apparatus (e.g., an image of a drain cup structure without adhesion of coating materials), a predefined upper limit of surface coverage and/or thickness of a residue adhered to the drain cup structure, a predefined upper limit usage of coating materials consumed by the lithography apparatus, and/or a predefined vacuum signature (e.g., pressure or gas flow) at the inlet region. The comparison can include subtracting the baseline cleanliness requirement from the contamination characteristic. For example, the contamination characteristic can be an image (e.g., a visual signature) collected from one or more areas of the drain cup structure's sidewalls, where the comparison can include pixel subtraction between the collected image and the predefined image of the drain cup structure's sidewalls without contamination. In some embodiments, the comparison can include subtracting the determined surface coverage/thickness of the contaminants at the drain cup structure from the predefined upper limit of surface coverage/thickness, subtracting the determined usages of each coating material from the predefined upper limit of usage, and/or subtracting the determined pressure/gas flow at the inlet region of the ventilation pump from the predefined upper limit of pressure/gas flow. In some embodiments, the comparison can be performed by a computer system (e.g., the lithography apparatus's controller unit), such as the computer system described above with respect to FIGS. 1 and 2.

In operation 330, a decontamination process for the drain cup structure is triggered based on the comparison in operation 320. The decontamination process can include dispensing a solvent towards the drain cup structure to dissolve or etch the contaminants at the drain cup structure. For example, the solvent can be dispensed for a predefined length of time to decontaminate the contaminants adhered to sidewalls of the drain cup structure. In some embodiments, the solvent dispensing can continue until a contamination characteristic associated with the decontaminated drain cup structure meets the baseline cleanliness requirement. The triggering can also include issuing a preventive maintenance alert to apply solvent to the drain cup structure's surfaces. In some embodiments, triggering of the decontamination process is described above with respect to FIG. 1.

Figure 4:
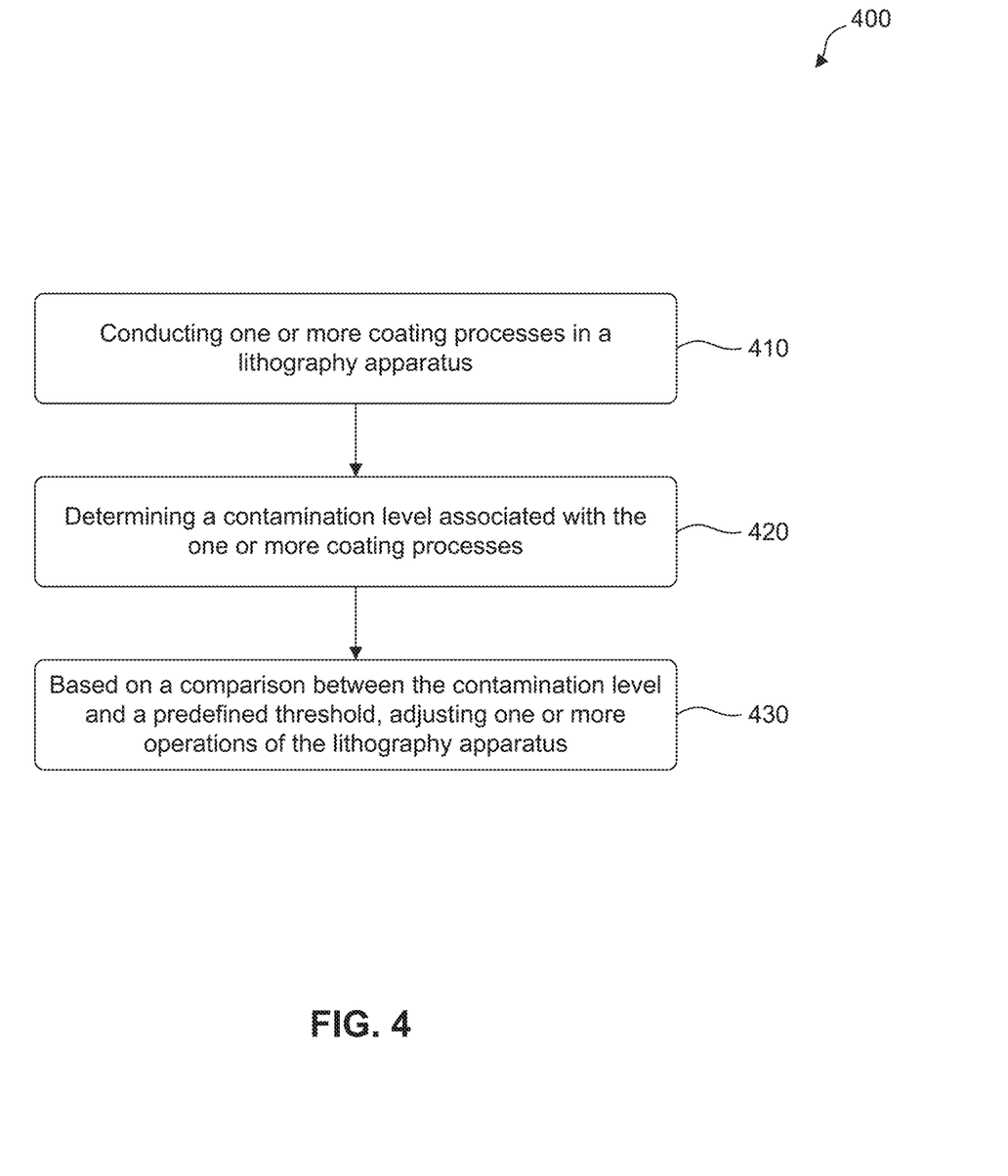
FIG. 4 illustrates a method for operating a lithography apparatus, according to some embodiments.

FIG. 4 is a method 400 for operating a lithography apparatus, according to some embodiments of the present disclosure. Operations shown in method 400 are not exhaustive; other operations can be performed as well before, after, or between any of the illustrated operations. In some embodiments, operations of method 400 can be performed in a different order. Variations of method 400 are within the scope of the present disclosure.

Method 400 begins with operation 410, where one or more coating processes are conducted in the lithography apparatus. Each of the one or more coating processes can include securing a substrate on a chuck of the lithography apparatus, dispensing a coating material on one or more areas of the substrate's top surface, and spinning the substrate. After each of the one or more coating processes, a portion of the respective coating material can be uniformly distributed on the respective substrate's top surface, while another portion of the respective coating material (e.g., a residue) can remain in the lithography apparatus. For example, the residue can be sprayed onto a drain cup structure of the lithography apparatus, thus causing a contamination in the lithography apparatus. In some embodiments, the one or more coating processes are described above with respect to FIG. 1.

In operation 420, a contamination level associated with the one or more coating processes is determined. The contamination level can be determined by summing multiple individual contamination levels associated with each of the one or more coating processes, where each of the individual contamination levels can be associated with a usage of the respective coating material in each of the one or more coating processes. In some embodiments, each individual contamination level can be associated with physical properties (e.g., viscosity and/or density) of the respective coating material. For example, a coating material with higher viscosity and/or heavier usage in a coating process can introduce a higher contamination level in the lithography apparatus. Accordingly, the determination of the contamination level can include determining a coefficient of each of the coating materials based on the physical properties of each coating material and calculating a weighted sum based on the coefficients and the usages of the coating materials in each coating process. In some embodiments, a usage of a coating material in a coating process can be determined by measuring a volume of the coating material consumed by the coating process, where the volume can be further determined by measuring a flow rate and a dispensing time of the coating material during the coating process. In some embodiments, a usage of a coating material can be determined by measuring a weight of the coating material consumed by the coating process, where the weight can be determined based on the measured volume and the coating material's density. In some embodiments, the determination of the contamination level is described above with respect to FIG. 2.

In operation 430, one or more operations of the lithography apparatus are adjusted based on a comparison between the contamination level and a predefined threshold. In response to the contamination level being higher than the predefined threshold, the adjustments can include removing contaminants from the drain cup structure and/or a ventilation conduit of the lithography apparatus. In some embodiments, the removal of the contaminants can include placing a substrate over the lithography apparatus's chuck, dispensing a solvent on a back surface of the substrate, and spinning the substrate to provide a centrifugal force to spray the dispensed solvent to the drain cup structure and/or the ventilation conduit. In some embodiments, the adjustment can include aborting an on-going lithography process and/or a subsequent lithography process. For example, in response to the contamination being higher than the predefined threshold, an on-going photoresist coating process may continue to meet a manufacturing schedule and a subsequent photoresist coating processes can be aborted to avoid potential manufacturing yield concerns associated with the contamination. The adjustment can further include interlocking the operations of the lithography apparatus, such as triggering a preventive maintenance alert to hand-wash the lithography apparatus's drain cup structure, prohibiting the use of coating material with high viscosity, and/or adjusting a manufacturing schedule of a semiconductor device using the lithography apparatus. For example, the adjustment can notify supply-chain management to prepare an inventory of a new solvent to further decontaminate the lithography apparatus.

Further, after operation 430, the contamination level can be reset based on the adjustment of one or more operations in operation 430. For example, the contamination level can be reset to zero if the dispensed solvent completely dissolves the contaminants (e.g., the contaminants are completely removed by operation 430.) In some embodiments, the contamination level can be reset to a fraction of the original contamination level (e.g., the contaminants are partially removed by operation 430.)

Figure 5:
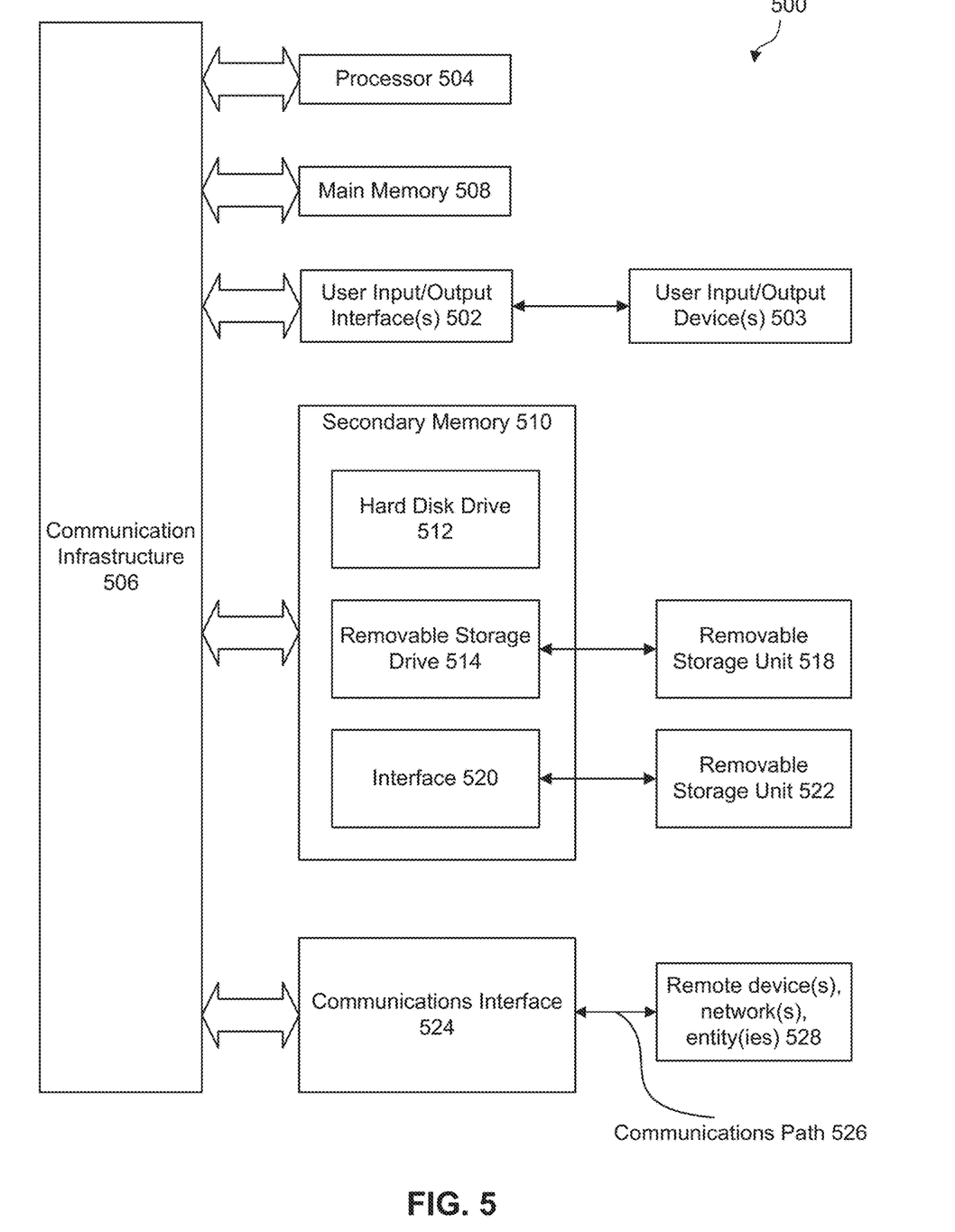
FIG. 5 illustrates a computer system for implanting various embodiments of the present disclosure, according to some embodiments.

FIG. 5 is an illustration of an example computer system 500 in which various embodiments of the present disclosure can be implemented, according to some embodiments. Computer system 500 can be used, for example, in controller unit 170 of FIG. 1. Computer system 500 can be any well-known computer capable of performing the functions and operations described herein. For example, and without limitation, computer system 500 can be capable of processing and transmitting signals. Computer system 500 can be used, for example, to execute one or more operations of lithography apparatus 100, method 300, and/or method 400.

Computer system 500 includes one or more processors (also called central processing units, or CPUs), such as a processor 504. Processor 504 is connected to a communication infrastructure or bus 506, Computer system 500 also includes input/output device(s) 403, such as monitors, keyboards, pointing devices, etc., that communicate with communication infrastructure or bus 506 through input/output interface(s) 502. A control tool can receive instructions to implement functions and operations described herein—e.g., the functions of lithography apparatus 100 described in FIG. 1 and the method/process described in FIGS. 2-4—via input/output device(s) 503. Computer system 500 also includes a main or primary memory 508, such as random access memory (RAM). Main memory 508 can include one or more levels of cache. Main memory 508 has stored therein control logic (e.g., computer software) and/or data. In some embodiments, the control logic (e.g., computer software) and/or data can include one or more of the functions described above with respect to lithography apparatus 100. In some embodiments, processor 504 can be configured to execute the control logic stored in main memory 508.

Computer system 500 can also include one or more secondary storage devices or memory 510. Secondary memory 510 can include, for example, a hard disk drive 512 and/or a removable storage device or drive 514. Removable storage drive 514 can be a floppy disk drive, a magnetic tape drive, a compact disk drive, an optical storage device, tape backup device, and/or any other storage device/drive.

Removable storage drive 514 can interact with a removable storage unit 518. Removable storage unit 518 includes a computer usable or readable storage device with computer software (control logic) and/or data stored thereon. Removable storage unit 518 can be a floppy disk, magnetic tape, compact disk, DVD, optical storage disk, and/any other computer data storage device. Removable storage drive 514 reads from and/or writes to removable storage unit 518 in a well-known manner.

According to some embodiments, secondary memory 510 can include other mechanisms, instrumentalities or other approaches for allowing computer programs and/or other instructions and/or data to be accessed by computer system

500. Such mechanisms, instrumentalities or other approaches can include, for example, a removable storage unit 522 and an interface 520. Examples of the removable storage unit 522 and the interface 520 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 510, removable storage unit 518, and/or removable storage unit 522 can include one or more of the functions described above with respect to the wet bench structure.

Computer system 500 can further include a communication or network interface 524. Communication interface 524 enables computer system 500 to communicate and interact with any combination of remote devices, remote networks, remote entities, etc. (individually and collectively referenced by reference number 528). For example, communication interface 524 can allow computer system 500 to communicate with remote devices 528 over communications path 526, which can be wired and/or wireless, and which can include any combination of LANs, WANs, the Internet, etc. Control logic and/or data can be transmitted to and from computer system 500 via communication path 526.

The functions/operations in the preceding embodiments can be implemented in a wide variety of configurations and architectures. Therefore, some or all of the operations in the preceding embodiments—e.g., the functions of lithography apparatus 100 described in FIG. 1 and the method/process described in FIGS. 2-4—can be performed in hardware, in software or both. In some embodiments, a tangible apparatus or article of manufacture including a tangible computer useable or readable medium with control logic (software) stored thereon is also referred to herein as a computer program product or program storage device. This includes, but is not limited to, computer system 500, main memory 508, secondary memory 510 and removable storage units 518 and 522, as well as tangible articles of manufacture embodying any combination of the foregoing. Such control logic, when executed by one or more data processing devices (such as computer system 500), causes such data processing devices to operate as described herein. For example, the hardware/equipment can be connected to or be part of element 528 (remote device(s), network(s), entity(ies) 528) of computer system 500.

In some embodiments, a semiconductor apparatus can include a chuck configured to hold a substrate, a first drain cup surrounding the chuck, and a detection module disposed in space between the first drain cup and the chuck and configured to monitor sidewalk of the first drain cup.

In some embodiments, a method can include determining a contamination characteristic of a lithography apparatus by measuring a visual signature, an optical signature, an acoustic signature, a vacuum signature, or a material usage signature associated with one or more coating materials consumed by the lithography apparatus. The method can further include comparing the contamination characteristic to a baseline cleanliness requirement and triggering a decontamination process to remove the residue associated with the one or more coating materials based on the comparison.

In some embodiments, a method for operating a lithography apparatus can include conducting one or more coating processes in the lithography apparatus, determining a contamination level associated with the one or more coating processes, and adjusting one or more operations of the lithography apparatus to reduce the contamination level based on a comparison between the contamination level and a predefined threshold.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography apparatus, comprising:
   a photoresist coating unit configured to perform one or more coating processes on a substrate;
   a detection unit configured to determine a contamination level of a contaminant from the one or more coating processes, the contaminant adhering to a sidewall of the lithography apparatus; and
   a controller unit configured to adjust one or more operations of the lithography apparatus based on a comparison between the contamination level and a baseline cleanliness requirement of the lithography apparatus.

2. The lithography apparatus of claim 1, wherein the photoresist coating unit comprises:
   a chuck configured to hold the substrate; and
   a first drain cup surrounding the chuck;
   wherein the detection unit is located between the first drain cup and the chuck.

3. The lithography apparatus of claim 2, where in the photoresist coating unit further comprises a second drain cup surrounding the chuck and being surrounded by the first drain cup.

4. The lithography apparatus of claim 1, wherein the detection unit comprises one or more of:
   an image sensor;
   a fiber sensor;
   an optical unit configured to transmit and receive one or more optical signals; and
   an acoustic unit configured to transmit and receive one or more acoustic signals.

5. The lithography apparatus of claim 2, wherein the detection unit is configured to monitor sidewalls of the first drain cup.

6. The lithography apparatus of claim 1, further comprising a cleaning unit configured to trigger a decontamination process to remove residue associated with the one or more coating operations.

7. A lithography apparatus, comprising:
   a detection unit configured to determine a contamination characteristic of the lithography apparatus by measuring a signature of one or more coating materials adhered to a sidewall of the lithography apparatus;
   a cleaning unit configured to trigger a decontamination process to remove residue associated with the one or more coating materials based on a comparison between the contamination level and a baseline cleanliness requirement of the lithography apparatus.

8. The lithography apparatus of claim 7, further comprising a photoresist coating unit configured to perform one or more coating processes on a substrate.

9. The lithography apparatus of claim 8, where in the photoresist coating unit comprises:
a chuck configured to hold the substrate; and
a first drain cup surrounding the chuck;
wherein the detection unit is located between the first drain cup and the chuck and is configured to monitor sidewalls of the first drain cup.

10. The lithography apparatus of claim 9, wherein the photoresist coating unit further comprises a second drain cup surrounding the chuck and being surrounded by the first drain cup.

11. The lithography apparatus of claim 7, wherein the detection unit comprises an image sensor configured to measure a visual signature of one or more coating materials adhered to a sidewall of the lithography apparatus.

12. The lithography apparatus of claim 7, wherein the detection unit comprises a fiber sensor configured to measure an optical signature of one or more coating materials adhered to a sidewall of the lithography apparatus.

13. The lithography apparatus of claim 7, wherein the detection unit comprises an optical unit configured to measure an optical signature of one or more coating materials adhered to a sidewall of the lithography apparatus.

14. The lithography apparatus of claim 7, wherein the detection unit comprises an acoustic unit configured to measure an acoustic signature of one or more coating materials adhered to a sidewall of the lithography apparatus.

15. A non-transitory computer-readable medium containing computer-executable instructions that, when executed by a processor, cause the processor to perform a method, the method comprising:
determining, with a detection unit, a contamination characteristic of a lithography apparatus by receiving a signature of one or more coating materials adhered to the lithography apparatus; and
instructing a controller unit to adjust one or more operations of the lithography apparatus based on a comparison between the contamination characteristic and a baseline cleanliness requirement of the lithography apparatus.

16. The non-transitory computer-readable medium of claim 15, wherein the determining the contamination characteristic comprises detecting a thickness or a surface coverage of the one or more coating materials adhered to a drain cup of the lithography apparatus.

17. The non-transitory computer-readable medium of claim 15, wherein the determining the contamination characteristic comprises collecting a visual signature of a drain cup of the lithography apparatus.

18. The non-transitory computer-readable medium of claim 15, wherein the determining the contamination characteristic comprises:
emitting an optical radiation towards a drain cup of the lithography apparatus; and
measuring a reflected or scattered optical signal from the drain cup.

19. The non-transitory computer-readable medium of claim 15, wherein the determining the contamination characteristic comprises:
emitting an acoustic signal towards a drain cup of the lithography apparatus; and
measuring a reflected or scattered acoustic signal from the drain cup.

20. The non-transitory computer-readable medium of claim 15, wherein the determining the contamination characteristic comprises measuring a flow rate of the one or more coating materials.

* * * * *